United States Patent
Zhou

(10) Patent No.: US 10,504,903 B1
(45) Date of Patent: Dec. 10, 2019

(54) SEMICONDUCTOR DEVICE AND MANUFACTURING METHOD THEREOF

(71) Applicant: UNITED MICROELECTRONICS CORP., Hsin-Chu (TW)

(72) Inventor: Zhibiao Zhou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/000,911

(22) Filed: Jun. 6, 2018

(30) Foreign Application Priority Data

May 24, 2018 (TW) .............................. 107117816 A

(51) Int. Cl.
| | |
|---|---|
| *H01L 27/10* | (2006.01) |
| *H01L 27/105* | (2006.01) |
| *H01L 29/423* | (2006.01) |
| *H01L 29/06* | (2006.01) |
| *H01L 29/417* | (2006.01) |

(52) U.S. Cl.
CPC ...... *H01L 27/1052* (2013.01); *H01L 29/0649* (2013.01); *H01L 29/41725* (2013.01); *H01L 29/42312* (2013.01)

(58) Field of Classification Search
CPC ........... H01L 29/0649; H01L 29/41725; H01L 29/42312
See application file for complete search history.

(56) References Cited

U.S. PATENT DOCUMENTS

2013/0126996 A1* 5/2013 Jeong ..................... H01L 43/08
257/421

OTHER PUBLICATIONS

Zhou, Title of Invention: Semiconductor Device Integrated With Memory Device and Fabrication Method Thereof, U.S. Appl. No. 15/909,592, filed Mar. 1, 2018.

* cited by examiner

*Primary Examiner* — Trang Q Tran
(74) *Attorney, Agent, or Firm* — Winston Hsu

(57) ABSTRACT

A semiconductor device includes a substrate, a semiconductor channel layer, a gate electrode, and a first memory structure. The semiconductor channel layer is disposed on the substrate. The gate electrode and the first memory structure are disposed on the semiconductor channel layer. The first memory structure includes a first bottom plate, a first top plate, and a first memory element layer. The first top plate is disposed on the first bottom plate. The first memory element layer is disposed between the first bottom plate and the first top plate. The first bottom plate contacts the semiconductor channel layer. Purposes of process simplification and/or memory density enhancement may be achieved by integrating a transistor with a memory structure.

19 Claims, 10 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a memory structure and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor connected with a capacitor. Generally, semiconductor processes may be roughly divided into a front end of line (FEOL) process for forming transistors on a wafer and a back end of line (BEOL) process for forming parts such as connection structures, inter layer dielectric, interconnection structure, and contact pads on the transistors. The integrity of the integrated circuit may be increased when memory cells are formed by the BEOL process. However, there are many problems, such as process complexity, low manufacturing yield, and limitation of memory cell density when forming the memory cells by the BEOL process, and appropriate design modifications are required for improving these problems

SUMMARY OF THE INVENTION

A semiconductor device and a manufacturing method thereof are provided in the present invention. A memory structure is integrated with a transistor structure for process simplification and/or memory density enhancement.

According to an embodiment of the present invention, a semiconductor device is provided. The semiconductor device includes a substrate, a semiconductor channel layer, a gate electrode, and a first memory structure. The semiconductor channel layer is disposed on the substrate. The gate electrode is disposed on the semiconductor channel layer. The first memory structure is disposed on the semiconductor channel layer. The first memory structure includes a first bottom plate, a first top plate, and a first memory element layer. The first top plate is disposed on the first bottom plate. The first memory element layer is disposed between the first bottom plate and the first top plate. The first bottom plate contacts the semiconductor channel layer.

According to an embodiment of the present invention, a manufacturing method of a semiconductor device is provided. The manufacturing method includes the following steps. A semiconductor channel layer is formed on a substrate. A gate electrode is formed on the semiconductor channel layer. A first memory structure is formed on the semiconductor channel layer. The first memory structure includes a first bottom plate, a first top plate, and a first memory element layer. The first top plate is disposed on the first bottom plate. The first memory element layer is disposed between the first bottom plate and the first top plate. The first bottom plate contacts the semiconductor channel layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-7 are schematic drawings illustrating a manufacturing method of the semiconductor device according to the first embodiment of the present invention, wherein FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
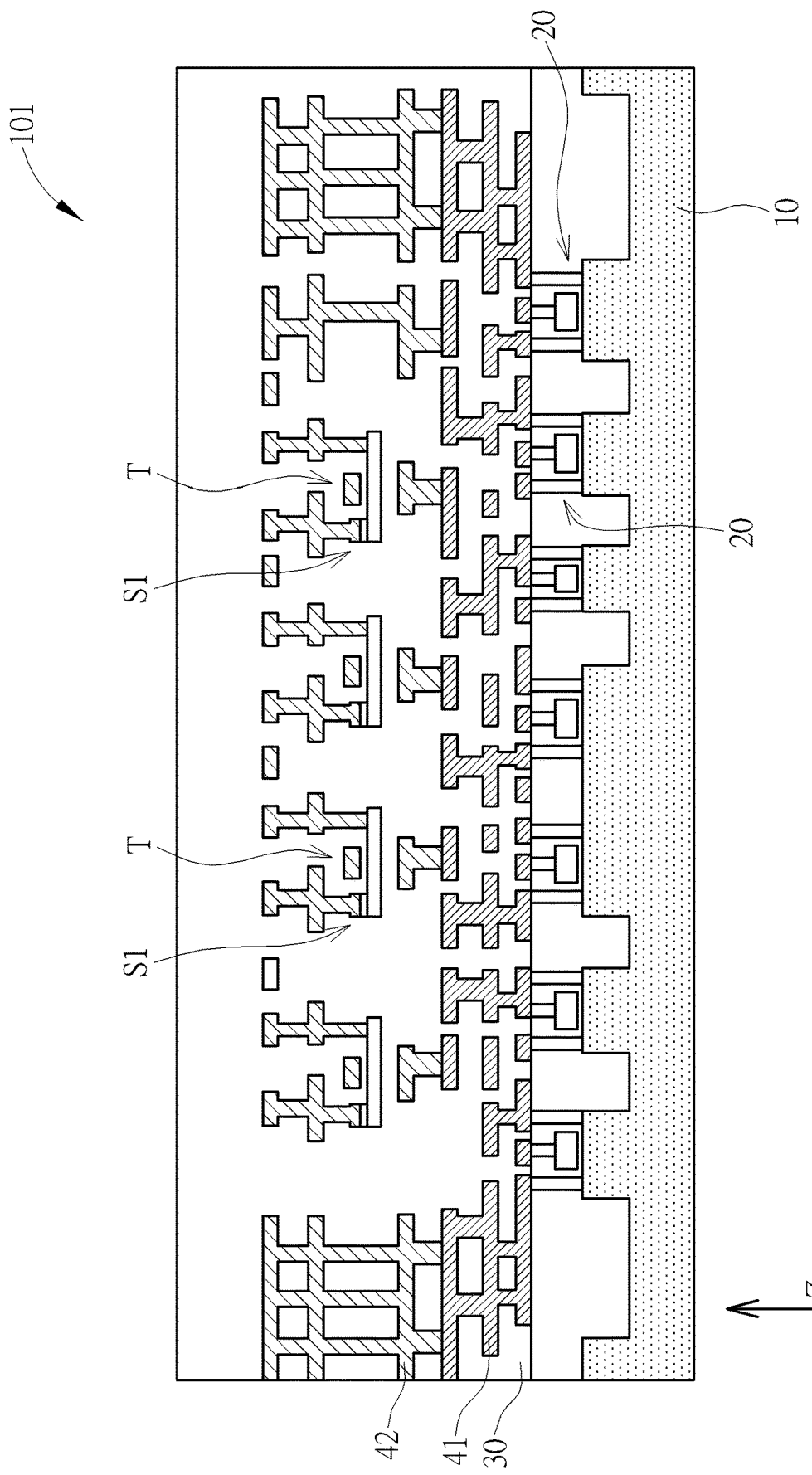
FIG. 1 is a schematic drawing illustrating a semiconductor device according to a first embodiment of the present invention.
Figure 2:
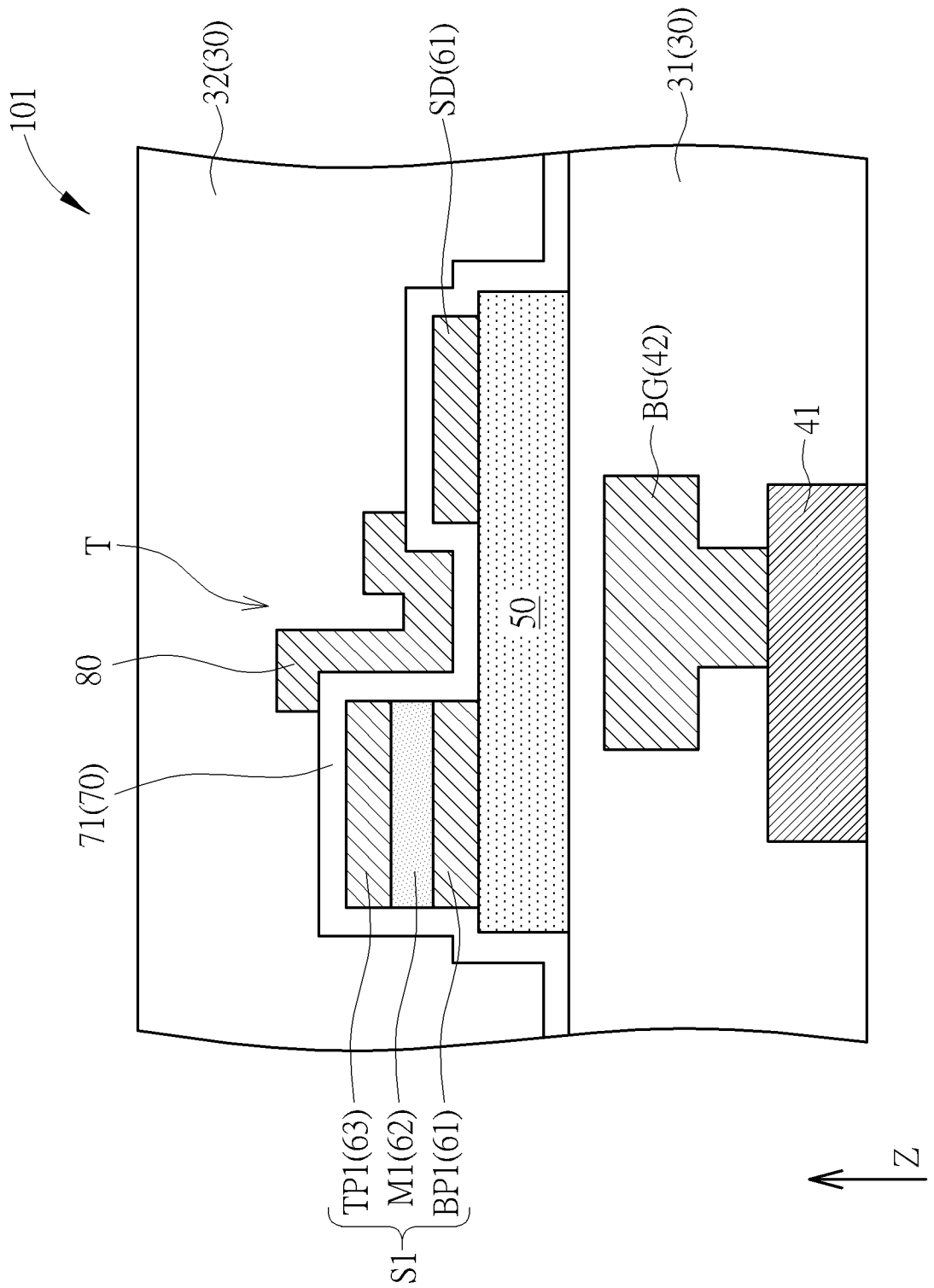
FIG. 2 is a partial enlarged view of the semiconductor device according to the first embodiment of the present invention.

Please refer to FIG. 1 and FIG. 2. FIG. 1 is a schematic drawing illustrating a semiconductor device according to a first embodiment of the present invention. FIG. 2 is a partial enlarged view of the semiconductor device in this embodiment. As shown in FIG. 1 and FIG. 2, a semiconductor device 101 is provided in this embodiment. The semiconductor device 101 includes a substrate 10, a semiconductor channel layer 50, a gate electrode 80, and a first memory structure S1. The semiconductor channel layer 50 is disposed on the substrate 10. The gate electrode 80 and the first memory structure S1 are disposed on the semiconductor channel layer 50. The first memory structure S1 includes a first bottom plate BP1, a first top plate TP1, and a first memory element layer M1. The first top plate TP1 is disposed on the first bottom plate BP1. The first memory element layer M1 is disposed between the first bottom plate BP1 and the first top plate TP1. The first bottom plate BP1 contacts the semiconductor channel layer 50. In some embodiments, the substrate 10 may include a semiconductor substrate or a non-semiconductor substrate. The semiconductor substrate mentioned above may include a silicon substrate, a silicon germanium substrate, or a silicon-on-insulator (SOI) substrate, and the none-semiconductor substrate mentioned above may include a glass substrate, a plastic substrate, or a ceramic substrate, but not limited thereto. For example, when the substrate is a semiconductor substrate, a plurality of metal oxide semiconductor (MOS) structures 20, such as silicon based field effect transistors, an interlayer dielectric layer 30, and interconnection structures disposed in the interlayer dielectric layer 30 (such as a first interconnection structure 41 and a second interconnection structure 42 shown in FIG. 1) may be formed on the substrate 10, and the semiconductor channel layer 50, the gate electrode 80, and the first memory structure S1 may be regarded as being disposed in the interconnection structure (such as the second interconnection structure 42), but not limited thereto. In other words, in some embodiments, the semiconductor device 101 may further include the first interconnection structure 41, the second interconnection structure 42, and the metal oxide semiconductor structures 20. The first interconnection structure 41 may be disposed between the substrate 10 and the semiconductor channel layer 50, and the metal oxide semiconductor structures 20 may be disposed between the substrate 10 and the first interconnection structure 41, but not limited thereto.

As shown in FIG. 1 and FIG. 2, in some embodiments, the semiconductor device 101 may further include a gate dielectric layer 71 and a source/drain electrode SD. The source/drain electrode SD is disposed on the semiconductor channel layer 50. The gate dielectric layer 71 is disposed on the semiconductor channel layer 50, the first memory structure S1, and the source/drain electrode SD, and the gate electrode 80 is disposed on the gate dielectric layer 71. The gate electrode 80, the gate dielectric layer 71, the semiconductor channel layer 50, the source/drain electrode SD, and the first bottom plate BP1 may form a transistor T. In other words, the first bottom plate BP1 of the first memory structure S1 may be another source/drain electrode in the transistor T, and one source/drain electrode of the transistor T may be used as the first bottom plate BP1 of the first memory structure S1 in order to integrate the transistor T and the first memory structure S1 for structure simplification and process simplification. Additionally, in some embodiments, the gate electrode 80 may overlap a part of the first memory structure S1 and a part of the source/drain electrode SD in a thickness direction Z of the substrate 10. Therefore, apart of the first memory structure S1 (such as apart of the first top plate TP1, apart of the first memory element layer M1, and/or a part of the first bottom plate BP1) may be disposed between the gate electrode 80 and the semiconductor channel layer 50 in the thickness direction Z of the substrate 10, but not limited thereto. Additionally, in some embodiments, the gate electrode may not overlap the first memory structure S1 and/or the source/drain electrode SD according to some considerations.

In some embodiments, the gate electrode 80, the first bottom plate BP1, the first top plate TP1, the source/drain electrode SD, the first interconnection structure 41, and the second interconnection structure 42 may respectively include metal conductive materials, such as tungsten (W), aluminum (Al), copper (Cu), titanium aluminide (TiAl), titanium (Ti), titanium nitride (TiN), tantalum (Ta), tantalum nitride (TaN), titanium aluminum oxide (TiAlO), or other suitable metal or non-metal conductive materials. The gate dielectric layer 71 may include silicon oxide, silicon oxynitride, a high dielectric constant (high-k) material, or other appropriate dielectric materials. The high-k material mentioned above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other appropriate high-k materials. The semiconductor channel layer 50 may include a semiconductor material, such as an oxide semiconductor material, a polysilicon semiconductor material, an amorphous silicon semiconductor material, or other suitable semiconductor materials. The oxide semiconductor material mentioned above may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. Additionally, the semiconductor channel layer 50 may be a single layer or a multiple layer structure formed by the above-mentioned oxide semiconductor materials, and the crystalline conditions of the semiconductor channel layer 50 is not limited also. For example, the semiconductor channel layer 50 may be amorphous IGZO (a-IGZO), crystal IGZO (c-IGZO), or C-axis aligned crystal IGZO (CAAC-IGZO).

In addition, the first memory structure S1 may include a capacitor structure, a random access memory (RAM) structure, a resistive RAM (RRAM) structure, a phase change RAM (PCRAM) structure, a magnetoresistive RAM (MRAM) structure, a ferroelectric RAM (FeRAM) structure, or other suitable memory structures. In the first memory structure S1, the first bottom plate BP1 and the first top plate TP1 may be regarded as a bottom electrode and a top electrode respectively, and the first memory element layer M1 disposed between the first bottom plate BP1 and the first top plate TP1 may include different material compositions in accordance with the type of the first memory structure S1. Therefore, the first memory element layer M1 in the first memory structure S1 may include a dielectric material, a material with switchable resistance, a phase change material, a magnetic tunnel junction (MTJ) film stack, a ferroelectric material, or other suitable memory element materials. The dielectric material mentioned above may include a high-k material. The material with switchable resistance mentioned above may include oxide (such as silicon oxide, hafnium oxide, titanium oxide, tantalum oxide, and aluminum oxide), perovskite material, transition metal oxide, chalcogenide, colossal magnetoresistance (CMR) material (such as praseodymium calcium manganese oxide), or other suitable materials with switchable resistance. The phase change material mentioned above may include germanium antimony telluride ($Ge_2Sb_2Te_5$, GST) or other suitable phase change materials. The MTJ film stack mentioned above may include a stack composed of a metal conductive material, a ferromagnetic material (such as iron or cobalt-iron), and an antiferromagnetic material (such as iron manganese or cobalt/platinum multilayer), or a MTJ film stack formed by other suitable materials. The ferroelectric material mentioned above may include perovskite oxide material, such as hafnium zirconium oxide ($HfZrO_x$), barium titanate ($BaTiO_3$), lead titanate ($PbTiO_3$), lead zirconate titanate ($PbZr_xTi_{1-x}O_3$, PZT), and barium strontium titanate ($Ba_xSr_{1-x}TiO_3$, BST), or other suitable ferroelectric materials.

Figure 3:
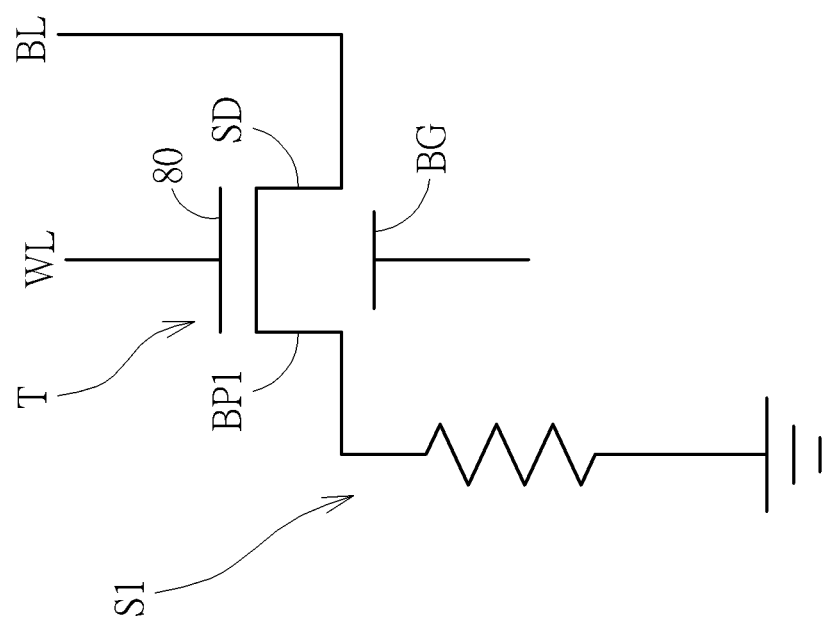
FIG. 3 is a schematic circuit diagram of the semiconductor device according to the first embodiment of the present invention.

Please refer to FIG. 2 and FIG. 3. FIG. 3 is a schematic circuit diagram of the semiconductor device 101 in this embodiment. As shown in FIG. 2 and FIG. 3, the gate electrode 80 of the transistor T may be electrically connected with a word line WL, and the source/drain electrode SD of the transistor T may be electrically connected with a bit line BL. When the first memory structure S1 is a resistive random access memory (RRAM) structure, a terminal of the first memory structure S1 (such as the first bottom plate BP1) may be connected with the transistor T, and another terminal of the first memory structure S1 (such as the first top plate TP1) may be connected to ground, but not limited thereto. Under this circumstance, by applying different electric fields to the first memory structure S1, the first memory element layer M1 may have different resistance for data storage. For example, when a memory cell composed of the transistor T and the first memory structure S1 is not chosen, there may be not any signal applied to the source/drain electrode SD from the bit line BL, and a low level signal may be applied to the gate electrode 80 by the word line WL. In a writing operation, a high level signal may be applied to the gate electrode 80 by the word line WL, and a set voltage ($V_{set}$) may be applied to the source/drain electrode SD by the bit line BL. In a reading operation, a high level signal may be applied to the gate electrode 80 by the word line WL, and the resistance may be detected via the bit line BL. In a reset operation, a high level signal may be applied to the gate electrode 80 by the word line WL, and a reset voltage ($V_{reset}$) may be applied to the source/drain electrode SD by the bit line BL. It is worth noting that the operation method of the semiconductor device 101 in this embodiment is not limited to the conditions described above and may be modified according to design requirements and/or the types of the first memory structure S1. Additionally, in some embodiments, the semiconductor device 101 may further include a back gate electrode BG disposed under the semiconductor channel layer 50. Interference in the operations mentioned above may be reduced by the collaboration between the back gate electrode BG and the gate electrode 80, and the operation performance of the semiconductor device 101 may be improved accordingly, but not limited thereto.

Figure 4:
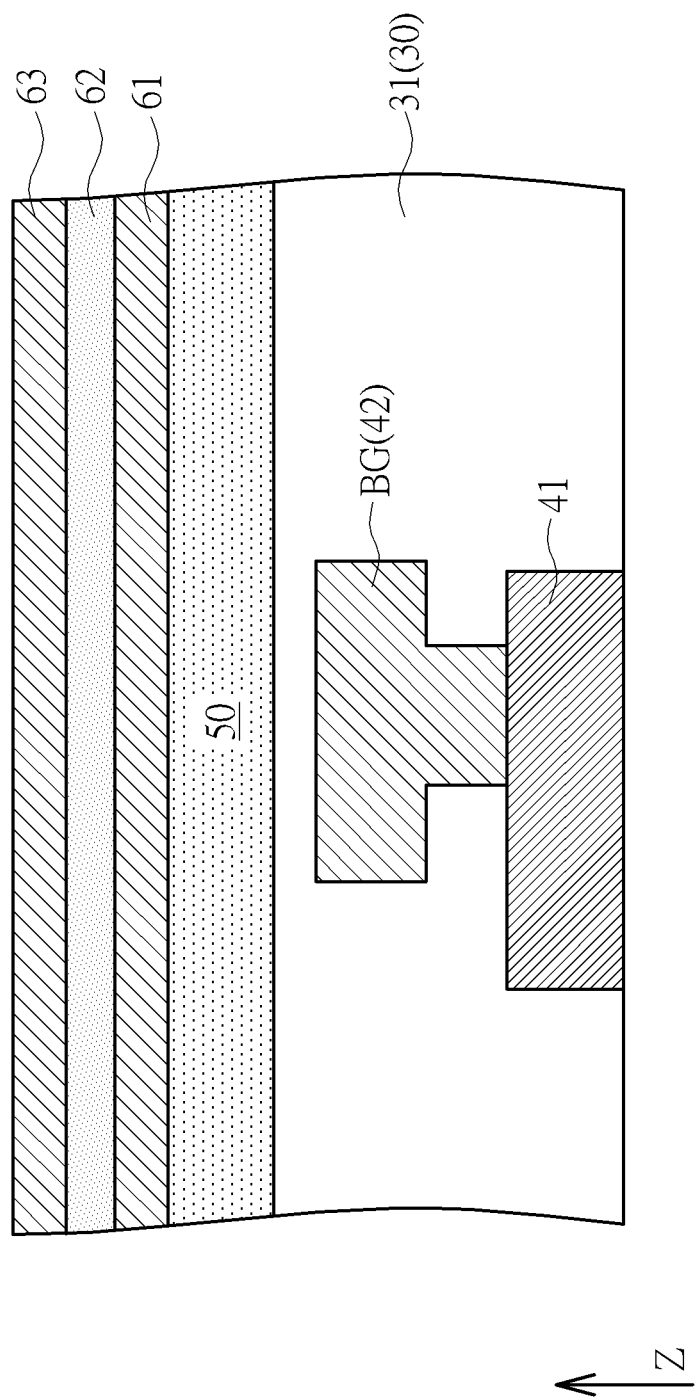
Figure 5:
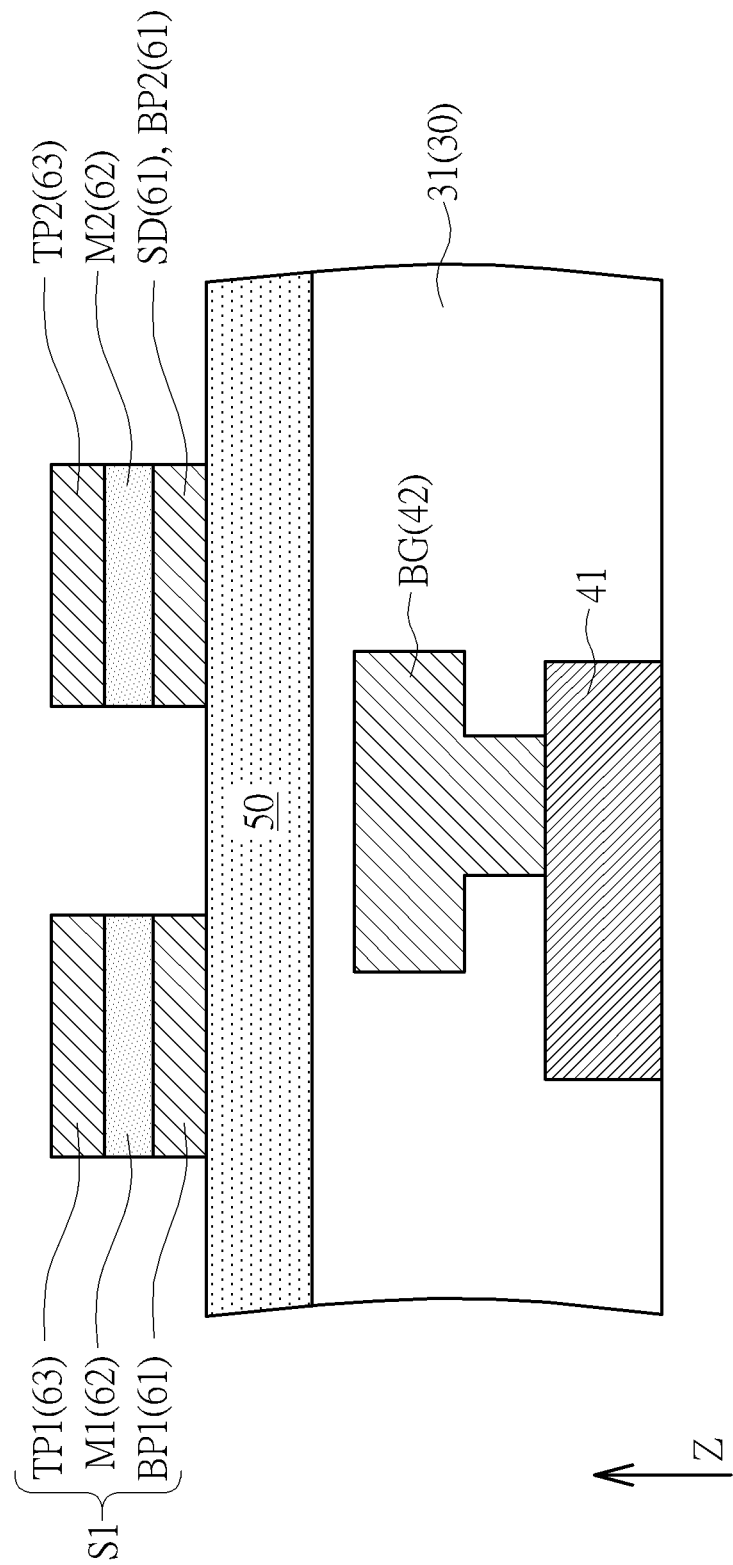
Figure 6:
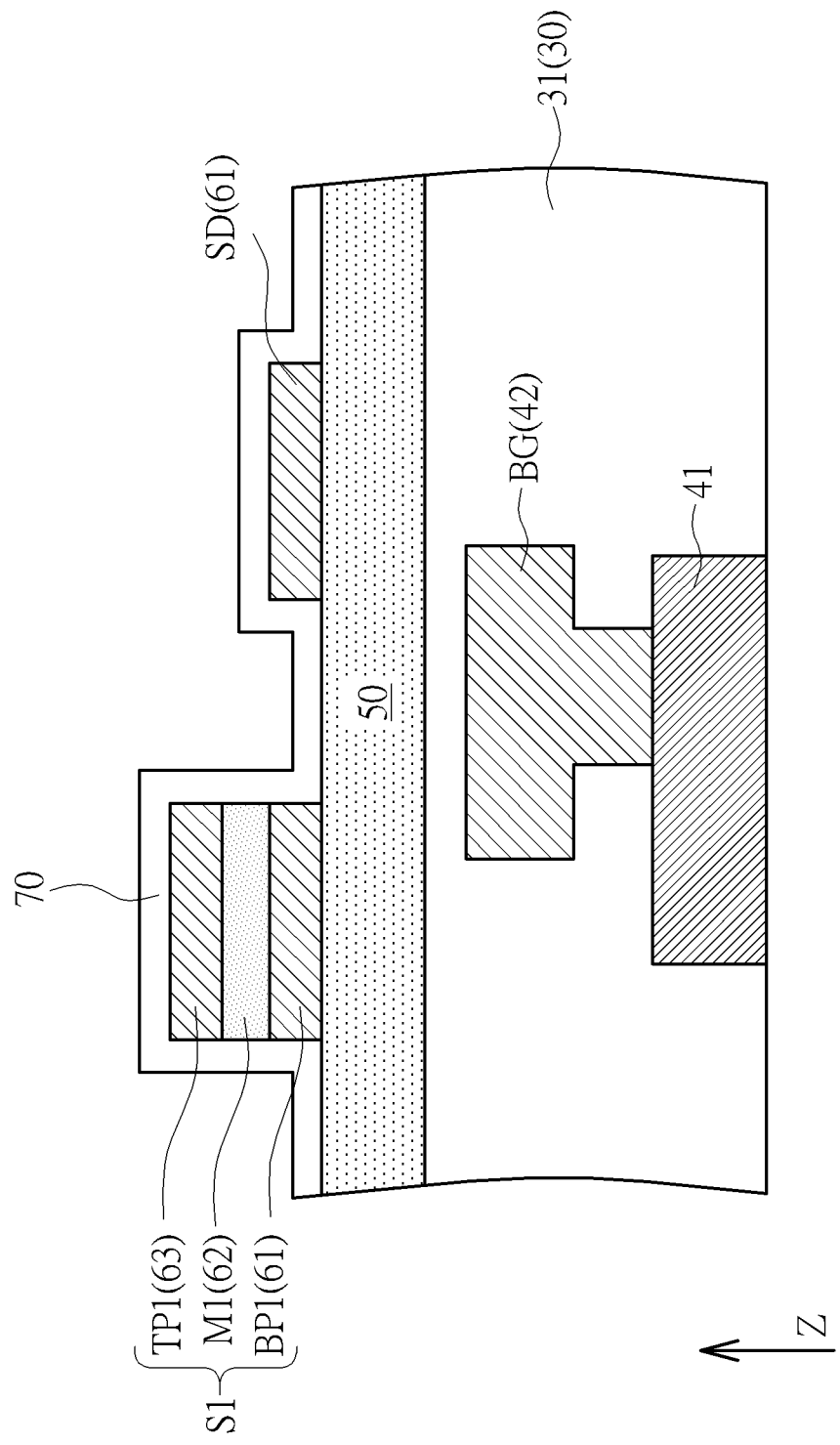
Figure 7:
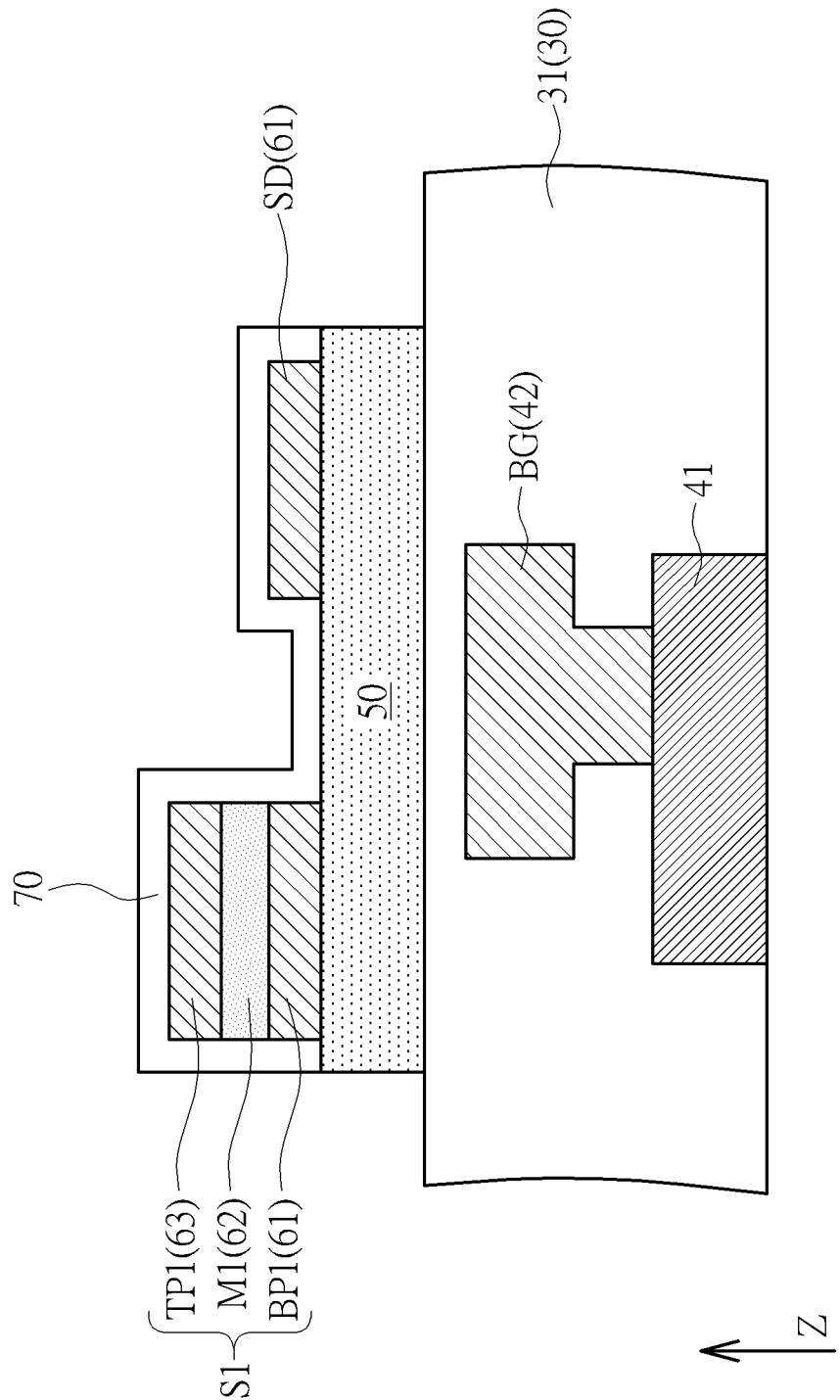

Please refer to FIGS. 4-7, FIG. 1, and FIG. 2. FIG. 2 and FIGS. 4-7 are schematic drawings illustrating a manufacturing method of the semiconductor device 101 in this embodiment. FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 2 may be regarded as a schematic drawing in a step subsequent to FIG. 7. As shown in FIG. 1 and FIG. 2, the manufacturing method of the semiconductor device in this embodiment may include the following steps. Firstly, the semiconductor channel layer 50 is formed on the substrate 10. The gate electrode 80 is formed on the semiconductor channel layer 50. The first memory structure S1 is formed on the semiconductor channel layer 50. The first memory structure S1 includes the first bottom plate BP1, the first top plate TP1, and the first memory element layer M1. The first top plate TP1 is disposed on the first bottom plate BP1. The first memory element layer M1 is disposed between the first bottom plate BP1 and the first top plate TP1. The first bottom plate BP1 contacts the semiconductor channel layer 50.

Specifically, the manufacturing method of the semiconductor device 101 in this embodiment may include but is not limited to the following steps. As shown in FIG. 2 and FIG. 4, the interlayer dielectric layer 30 may include a first interlayer dielectric layer 31 and a second interlayer dielectric layer 32. The first interlayer dielectric layer 31 and the second interlayer dielectric layer 32 may respectively include silicon oxide, silicon oxynitride, low dielectric constant (low-k) materials, or other suitable insulation materials. The back gate electrode BG may be formed in the first interlayer dielectric layer 31, the semiconductor channel layer 50 may be formed on the first interlayer dielectric layer 31, and the second interlayer dielectric layer 32 may cover the transistor T and the first memory structure S1, but not limited thereto. In some embodiments, the back gate electrode BG may be a part of the second interconnection structure 42 and/or the back gate electrode BG may be formed by the process of forming the second interconnection structure 42. The back gate electrode BG may be connected downwards to the first interconnection structure 41, and the back gate electrode BG may include metal conductive materials, such as tungsten, aluminum, copper, titanium aluminide, titanium, titanium nitride, tantalum, tantalum nitride, titanium aluminum oxide, or other suitable metal or non-metal conductive materials, but not limited thereto. For example, the first interconnection structure 41 and the second interconnection structure 42 may include a plurality of metal conductive layers and a plurality of conductive plugs alternately disposed in the thickness direction Z and connected with one another, and the back gate electrode BG and one metal conductive layer in the second interconnection structure 42 may be formed concurrently by the same process, but not limited thereto.

As shown in FIG. 4, the semiconductor channel layer 50, a first conductive layer 61, a memory element material 62, and a second conductive layer 63 may be sequentially formed on the first interlayer dielectric layer 31. In other words, the first conductive layer 61 is formed on the semiconductor channel layer 50, the memory element material 62 is formed on the first conductive layer 61, and the second conductive layer 63 is formed on the memory element material 62. Subsequently, as shown in FIG. 4 and FIG. 5, the second conductive layer 63, the memory element material 62, and the first conductive layer 61 are patterned for forming the first memory structure S1 and the source/drain electrode SD. In some embodiments, at least a part of the first conductive layer 61 may be patterned to be the first bottom plate BP1 and the source/drain electrode SD separated from each other. At least a part of the memory element material 62 may be patterned to be the first memory element layer M1 and a second memory element layer M2 separated from each other. At least a part of the second conductive layer 63 may be patterned to be the first top plate TP1 and a second top plate TP2 separated from each other. Therefore, the material composition of the first bottom plate BP may be identical to the material composition of the source/drain electrode SD, the material composition of the first memory element layer M1 may be identical to the material composition of the second memory element layer M2, and the material composition of the first top plate TP1 may be identical to the material composition of the second top plate TP2, but not limited thereto. In other words, the first bottom plate BP1 and the source/drain electrode SD may be formed on the same plane (such as the top surface of the semiconductor channel layer 50), and the first bottom plate BP1 and the source/drain electrode SD may be formed concurrently by the same process, but not limited thereto. Additionally, in some embodiments, the first bottom plate BP1 and the source/drain electrode SD may directly and physically contact the top surface of the semiconductor channel layer 50 respectively, and the first bottom plate BP1 may be regarded as another source/drain electrode. The first bottom plate BP1, the first memory element layer M1, and the first top plate TP1 may be stacked in the thickness direction Z to be the first memory structure S1, and the source/drain electrode SD, the second memory element layer M2, and the second top plate TP2 may be stacked in the thickness direction Z, but not limited thereto.

As shown in FIG. 5 and FIG. 6, in some embodiments, the second memory element layer M2 and the second top plate TP2 on the source/drain electrode SD may be removed, and a protection layer 70 may be formed covering the semiconductor channel layer 50, the first memory structure S1, and the source/drain electrode SD after the step of removing the second memory element layer M2 and the second top plate TP2. In some embodiments, the protection layer 70 may include am oxide semiconductor material similar to the semiconductor channel layer 50, a material similar to the gate dielectric layer, or other suitable materials. As shown in FIG. 7, the semiconductor channel layer 50 is then patterned for defining a semiconductor island structure required in the transistor. As shown in FIG. 2, before the step of forming the gate electrode 80, the gate dielectric layer 71 may be formed on the semiconductor channel layer 50 and the first memory structure S1, and the gate electrode 80 may be formed on the gate dielectric layer 71. In some embodiments, the second interlayer dielectric layer 32 may be formed covering the transistor T after the step of forming the gate electrode 80. The gate dielectric layer 71 and the protection layer 70 may be regarded as the gate dielectric layer in the transistor T when the material composition of the protection layer 70 is the same as the material composition of the gate dielectric layer 71. Therefore, the gate dielectric layer 71 may cover the semiconductor channel layer 50, the first memory structure S1, and the source/drain electrode SD, and the gate dielectric layer 71 may cover the sidewall of the semiconductor channel layer 50, the sidewall of the first bottom plate BP1, the sidewall of the first memory element layer M1, and the sidewall of the first top plate TP1, but not limited thereto.

It is worth noting that, in the present invention, the transistor T and the first memory structure S1 may be formed by the process of forming the interconnection structure, and the structure of the memory cell may be simplified by integrating the transistor T with the first memory structure S1. More memory cells composed of the transistor T and the first memory structure S1 may be formed at different levels in the interconnection structure for increasing the memory cell density accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
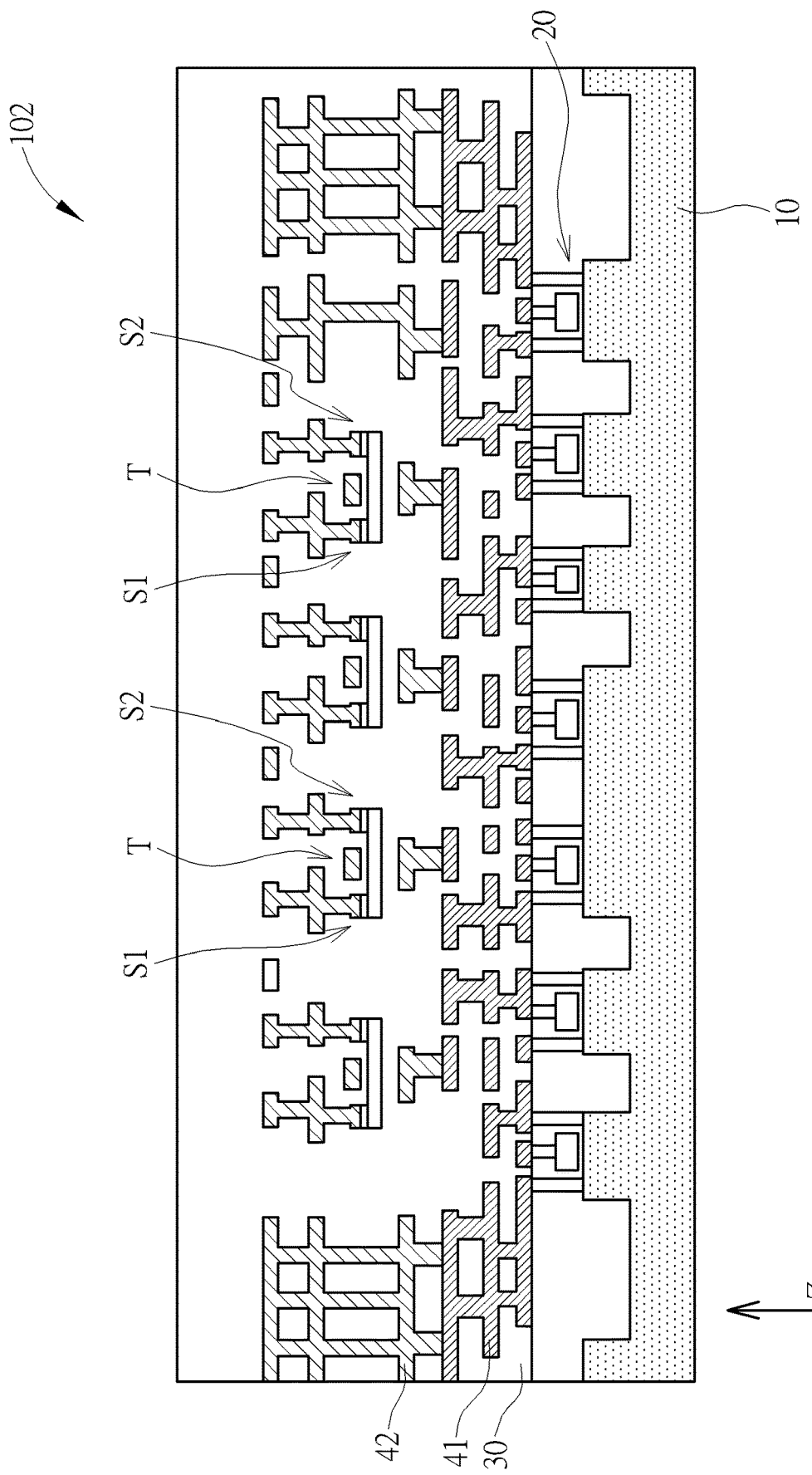
FIG. 8 is a schematic drawing illustrating a semiconductor device according to a second embodiment of the present invention.
Figure 9:
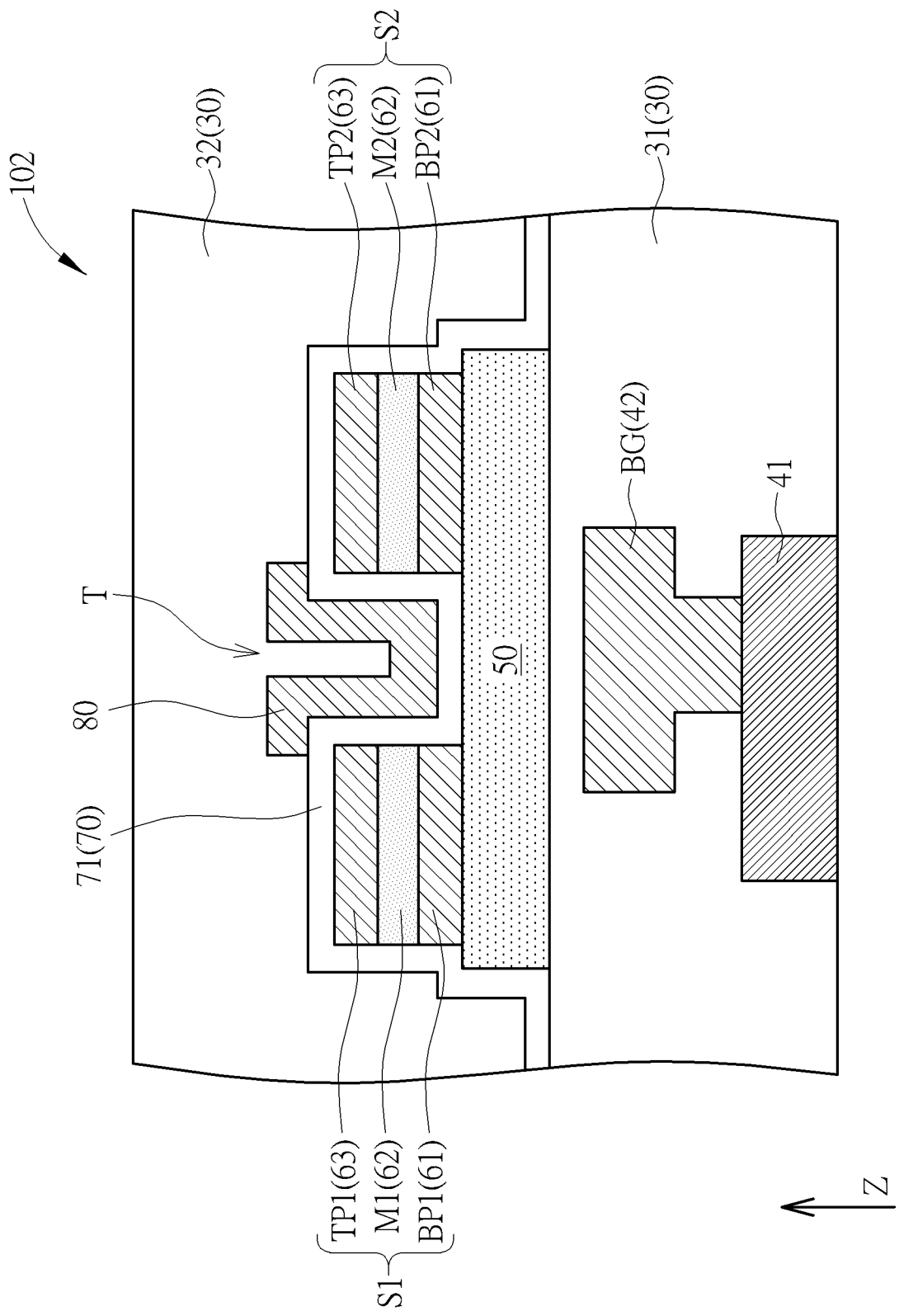
FIG. 9 is a partial enlarged view of the semiconductor device according to the second embodiment of the present invention.

Please refer to FIG. 8 and FIG. 9. FIG. 8 is a schematic drawing illustrating a semiconductor device 102 according to a second embodiment of the present invention. FIG. 9 is a partial enlarged view of the semiconductor device 102 in this embodiment. As shown in FIG. 8 and FIG. 9, the difference between the semiconductor device 102 in this embodiment and the semiconductor device in the first embodiment described above is that the semiconductor device 102 may further include a second memory structure S1 disposed on the semiconductor channel layer 50. The first memory structure S1 and the second memory structure S2 are disposed at two opposite sides of the gate electrode 80 respectively. The second memory structure S2 may include a second bottom plate BP2, a second memory element layer M2, and a second top plate TP2. The second top plate TP2 is disposed on the second bottom plate BP2; and the second memory element layer M2 is disposed between the second bottom plate BP2 and the second top plate TP2. The second bottom plate BP2 contacts the semiconductor channel layer 50. In this embodiment, the gate dielectric layer 71 may be disposed on the semiconductor channel layer 50, the first memory structure S1, and the second memory structure S2. The gate electrode 80, the gate dielectric layer 71, the semiconductor channel layer 50, the first bottom plate BP1, and the second bottom plate BP2 form a transistor T. In other words, the first bottom plate BP1 of the first memory structure S1 may be a source/drain electrode in the transistor T, and the second bottom plate BP2 of the second memory structure S2 may be another source/drain electrode in the transistor T. Accordingly, the structure and the process may be simplified by integrating the transistor T, the first memory structure S1, and the second memory structure S2.

In some embodiments, the gate electrode 80 may overlap a part of the first memory structure S1 and a part of the second memory structure S2 in the thickness direction Z of the substrate 10. Apart of the first memory structure S1 (such as a part of the first top plate TP1, a part of the first memory element layer M1, and/or a part of the first bottom plate BP1) may be disposed between the gate electrode 80 and the semiconductor channel layer 50 in the thickness direction Z of the substrate 10, and a part of the second memory structure S2 (such as a part of the second top plate TP2, a part of the second memory element layer M2, and/or apart of the second bottom plate BP2) may be disposed between the gate electrode 80 and the semiconductor channel layer 50 in the thickness direction Z of the substrate 10, but not limited thereto. In some embodiments, the gate electrode 80 may not overlap the first memory structure S1 and/or the second memory structure S2 according to some considerations. Additionally, the gate dielectric layer 71 in this embodiment may be formed on the semiconductor channel layer 50, the first memory structure S1, and the second memory structure S2, and the gate electrode 80 may be formed on the gate dielectric layer 71. Therefore, the gate dielectric layer 71 may cover the semiconductor channel layer 50, the first memory structure S1, and the second memory structure S2. The gate dielectric layer 71 may cover the sidewall of the semiconductor channel layer 50, the sidewall of the first bottom plate BP1, the sidewall of the first memory element layer M1, the sidewall of the first top plate TP1, the sidewall of the second bottom plate BP2, the sidewall of the second memory element layer M2, and the sidewall of the second top plate TP2, but not limited thereto. In some embodiments, the second memory structure S2 may include a random access memory (RAM) structure, a resistive RAM structure, a phase change RAM structure, a magnetoresistive RAM structure, a ferroelectric RAM structure, or other suitable memory structures. The material composition of the second memory element layer M2 may be similar to the material composition of the first memory element layer M1, but not limited thereto.

Figure 10:
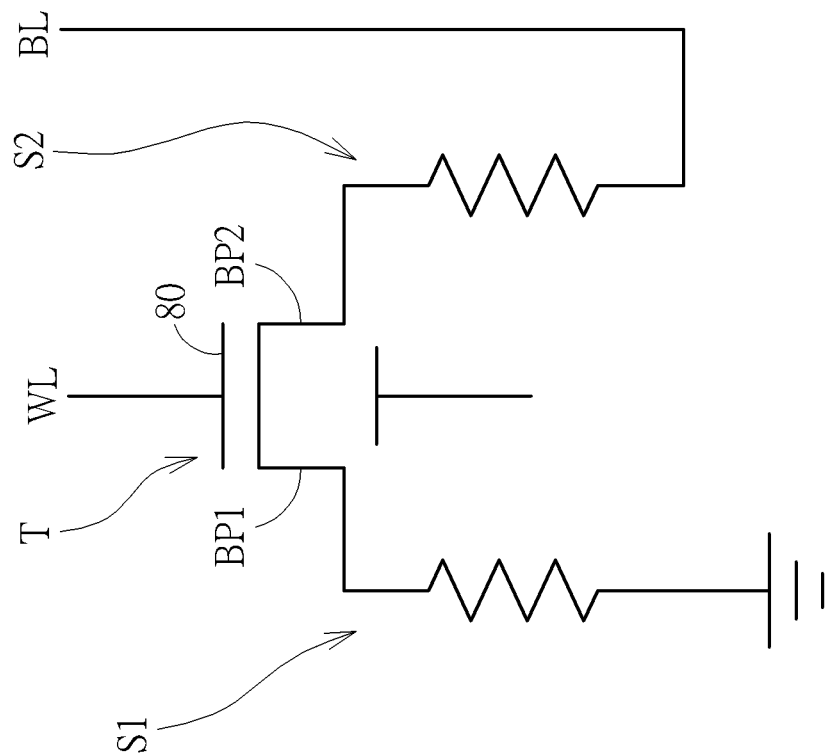
FIG. 10 is a schematic circuit diagram of the semiconductor device according to the second embodiment of the present invention.

Please refer to FIG. 9 and FIG. 10. FIG. 10 is a schematic circuit diagram of the semiconductor device 102 in this embodiment. As shown in FIG. 9 and FIG. 10, the gate electrode 80 of the transistor T may be electrically connected with the word line WL. When the first memory structure S1 and the second memory structure S2 are resistive random access memory structures, a terminal of the first memory structure S1 (such as the first bottom plate BP1) may be connected with the transistor T, another terminal of the first memory structure S1 (such as the first top plate TP1) may be connected to ground, a terminal of the second memory structure S2 (such as the second bottom plate BP2) may be connected with the transistor T, and another terminal of the second memory structure S2 (such as the second top plate TP2) may be electrically connected with the bit line BL, but not limited thereto. Under this circumstance, by applying different electric fields to the first memory structure S1 and/or the second memory structure S2, the first memory element layer M1 and/or the second memory element layer M2 may have different resistance for data storage. For example, when a memory cell composed of the transistor T, the first memory structure S1, and the second memory structure S2 is not chosen, there may be not any signal applied to the second memory structure S2 from the bit line BL, and a high level signal may be applied to the gate electrode 80 by the word line WL. In a writing operation, a low level signal may be applied to the gate electrode 80 by the word line WL, and a set voltage may be applied to the second top plate TP2 of the second memory structure S2 by the bit line BL. In a reading operation, a low level signal may be applied to the gate electrode 80 by the word line WL, and the resistance may be detected via the bit line BL. In a reset operation, a low level signal may be applied to the gate electrode 80 by the word line WL, and a reset voltage may be applied to the second top plate TP2 of the second memory structure S2 by the bit line BL. It is worth noting that the set voltage used in the writing operation of this embodiment may be higher than the set voltage used in the first embodiment described above (for example, the set voltage in this embodiment may be twice as high as the set voltage in the first embodiment), and the reset voltage used in the reset operation of this embodiment may be higher than the reset voltage used in the first embodiment described above (for example, the reset voltage in this embodiment may be twice as high as the reset voltage in the first embodiment) because of the two resistive random access memory structures, but not limited thereto. Additionally, because of the two resistive random access memory structures, the memory cell in this embodiment may be used to perform a multiple signal level operation. However, the operation method of the semiconductor device 102 in this embodiment is not limited to the conditions described above and may be modified according to design requirements and/or the types of the first memory structure S1 and the second memory structure S2.

Please refer to FIG. 5 and FIG. 9. FIG. 9 may be regarded as a schematic drawing in a step subsequent to 5. As shown in FIG. 5 and FIG. 9, in the manufacturing method of the semiconductor device 102, the second conductive layer 63, the memory element material 62, and the first conductive layer 61 may be patterned for forming the first memory structure S1 and the second memory structure S2. The first memory structure S1 and the second memory structure S2 are formed on the semiconductor channel layer 50. The first memory structure S1 and the second memory structure S2 may be formed at two opposite sides of the gate electrode 80 respectively. In other words, the first memory structure S1 and the second memory structure S2 may be formed concurrently by the same process, but not limited thereto. In some embodiments, at least a part of the first conductive layer 61 may be patterned to be the first bottom plate BP1 and the second bottom plate BP2 separated from each other, at least a part of the memory element material 62 may be patterned to be the first memory element layer M1 and the second memory element layer M2 separated from each other, and at least a part of the second conductive layer 62 may be patterned to be the first top plate TP1 and the second top plate TP2 separated from each other. The material composition of the first bottom plate BP1 may be identical to the material composition of the second bottom plate BP2, but not limited thereto. In other words, the first bottom plate BP1 and the second bottom plate BP2 may be formed on the same plane (such as the top surface of the semiconductor channel layer 50), and the first bottom plate BP1 and the second bottom plate BP2 may be formed concurrently by the same process, but not limited thereto. Additionally, in some embodiments, the first bottom plate BP1 and the second bottom plate BP2 may directly and physically contact the top surface of the semiconductor channel layer 50 respectively. The first bottom plate BP1, the first memory element layer M1, and the first top plate TP1 may be stacked in the thickness direction Z to be the first memory structure S1, and the second bottom plate BP2, the second memory element layer M2, and the second top plate TP2 may be stacked in the thickness direction Z to be the second memory structure S2.

To summarize the above descriptions, in the semiconductor device and the manufacturing method thereof according to the present invention, at least one source/drain electrode of the transistor may be integrated with the bottom plate of the memory structure for simplifying the structure and the process of the memory cell including the memory structure and the transistor. The memory cell density may be enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate;
a semiconductor channel layer disposed on the substrate;
a gate electrode disposed on the semiconductor channel layer;
a first memory structure disposed on the semiconductor channel layer, wherein the first memory structure comprises:
a first bottom plate;
a first top plate disposed on the first bottom plate; and
a first memory element layer disposed between the first bottom plate and the first top plate, wherein the first bottom plate contacts the semiconductor channel layer;
an interconnection structure disposed between the substrate and the semiconductor channel layer; and
a metal oxide semiconductor (MOS) structure disposed between the substrate and the interconnection structure.
2. The semiconductor device according to claim 1, further comprising:
a gate dielectric layer disposed on the semiconductor channel layer and the first memory structure, wherein the gate electrode is disposed on the gate dielectric layer.
3. The semiconductor device according to claim 1, wherein a part of the first top plate is disposed between the gate electrode and the semiconductor channel layer in a thickness direction of the substrate.
4. The semiconductor device according to claim 1, wherein the first memory structure comprises a random access memory (RAM) structure, a resistive RAM (RRAM) structure, a phase change RAM (PCRAM) structure, a magnetoresistive RAM (MRAM) structure, or a ferroelectric RAM (FeRAM) structure.
5. The semiconductor device according to claim 1, wherein the first memory element layer comprises a material with switchable resistance, a phase change material, a magnetic tunnel junction (MTJ) film stack, or a ferroelectric material.
6. The semiconductor device according to claim 1, further comprising:
a source/drain electrode disposed on the semiconductor channel layer; and a gate dielectric layer disposed on the semiconductor channel layer, the first memory structure, and the source/drain electrode, wherein the gate electrode, the gate dielectric layer, the semiconductor channel layer, the source/drain electrode, and the first bottom plate form a transistor.

7. The semiconductor device according to claim 1, further comprising:
a second memory structure disposed on the semiconductor channel layer, wherein the first memory structure and the second memory structure are disposed at two opposite sides of the gate electrode respectively, and the second memory structure comprises:
a second bottom plate;
a second top plate disposed on the second bottom plate; and
a second memory element layer disposed between the second bottom plate and the second top plate, wherein the second bottom plate contacts the semiconductor channel layer.

8. The semiconductor device according to claim 7, wherein a part of the second top plate is disposed between the gate electrode and the semiconductor channel layer in a thickness direction of the substrate.

9. The semiconductor device according to claim 7, wherein the second memory structure comprises a random access memory (RAM) structure, a resistive RAM (RRAM) structure, a phase change RAM (PCRAM) structure, a magnetoresistive RAM (MRAM) structure, or a ferroelectric RAM (FeRAM) structure.

10. The semiconductor device according to claim 7, further comprising:
a gate dielectric layer disposed on the semiconductor channel layer, the first memory structure, and the second memory structure, wherein the gate electrode, the gate dielectric layer, the semiconductor channel layer, the first bottom plate, and the second bottom plate form a transistor.

11. A manufacturing method of a semiconductor device, comprising:
forming a semiconductor channel layer on a substrate;
forming a gate electrode on the semiconductor channel layer; and
forming a first memory structure on the semiconductor channel layer, wherein the first memory structure comprises:
a first bottom plate;
a first top plate disposed on the first bottom plate; and
a first memory element layer disposed between the first bottom plate and the first top plate, wherein the first bottom plate contacts the semiconductor channel layer;
forming an interconnection structure, wherein the interconnection structure is located between the substrate and the semiconductor channel layer; and
forming a metal oxide semiconductor (MOS) structure, wherein the MOS structure is located between the substrate and the interconnection structure.

12. The manufacturing method of the semiconductor device according to claim 11, further comprising:
forming a gate dielectric layer on the semiconductor channel layer and the first memory structure before the step of forming the gate electrode, wherein the gate electrode is formed on the gate dielectric layer.

13. The manufacturing method of the semiconductor device according to claim 11, wherein a part of the first top plate is disposed between the gate electrode and the semiconductor channel layer in a thickness direction of the substrate.

14. The manufacturing method of the semiconductor device according to claim 11, further comprising:
forming a source/drain electrode on the semiconductor channel layer, wherein the source/drain electrode and the first bottom plate are formed concurrently by the same process.

15. The manufacturing method of the semiconductor device according to claim 11, further comprising:
forming a second memory structure on the semiconductor channel layer, wherein the first memory structure and the second memory structure are formed at two opposite sides of the gate electrode respectively, and the second memory structure comprises:
a second bottom plate;
a second top plate disposed on the second bottom plate; and
a second memory element layer disposed between the second bottom plate and the second top plate, wherein the second bottom plate contacts the semiconductor channel layer.

16. The manufacturing method of the semiconductor device according to claim 15, wherein a part of the second top plate is disposed between the gate electrode and the semiconductor channel layer in a thickness direction of the substrate.

17. The manufacturing method of the semiconductor device according to claim 15, further comprising:
forming a gate dielectric layer on the semiconductor channel layer, the first memory structure, and the second memory structure, wherein the gate electrode is formed on the gate dielectric layer.

18. The manufacturing method of the semiconductor device according to claim 15, wherein the first memory structure and the second memory structure are formed concurrently by the same process.

19. The manufacturing method of the semiconductor device according to claim 18, wherein the step of forming the first memory structure and the second memory structure comprises:
forming a first conductive layer on the semiconductor channel layer;
forming a memory element material on the first conductive layer;
forming a second conductive layer on the memory element material; and
patterning the second conductive layer, the memory element material, and the first conductive layer to form the first memory structure and the second memory structure.

* * * * *